(12) United States Patent
Fan et al.

(10) Patent No.: US 8,186,049 B2
(45) Date of Patent: May 29, 2012

(54) METHOD OF MAKING A CIRCUIT STRUCTURE

(75) Inventors: Chih-Peng Fan, Taoyuan County (TW); Yen-Ti Chia, Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 899 days.

(21) Appl. No.: 12/181,556

(22) Filed: Jul. 29, 2008

(65) Prior Publication Data

US 2009/0288858 A1 Nov. 26, 2009

(30) Foreign Application Priority Data

May 23, 2008 (TW) .............................. 97119179 A (51) Int. Cl.
*H05K 3/02* (2006.01)
(52) U.S. Cl. ................ 29/846; 29/830; 29/832; 29/852; 438/618; 438/622; 438/623
(58) Field of Classification Search .................... 29/825, 29/830, 832, 840, 852, 846; 438/618, 622, 438/623
See application file for complete search history.

(56) References Cited

U.S. PATENT DOCUMENTS

| 4,810,332 | A | 3/1989 | Pan |
| 5,011,580 | A | 4/1991 | Pan et al. |
| 5,071,518 | A | 12/1991 | Pan |
| 6,150,723 | A | 11/2000 | Harper et al. |
| 6,165,892 | A * | 12/2000 | Chazan et al. ................. 438/623 |
| 6,300,236 | B1 * | 10/2001 | Harper et al. ................. 438/618 |
| 7,285,867 | B2 * | 10/2007 | Matsuzaki et al. ............ 257/787 |

FOREIGN PATENT DOCUMENTS

| JP | 01-278043 | 11/1989 |
| JP | 10-022636 | 1/1998 |
| JP | 10-062799 | 3/1998 |
| JP | 10-075063 | 3/1998 |
| JP | 10-093241 | 4/1998 |
| JP | 11-191676 | 7/1999 |
| JP | 2001-144431 | 5/2001 |
| JP | 2004-349610 | 12/2004 |

* cited by examiner

*Primary Examiner* — Carl Arbes
(74) *Attorney, Agent, or Firm* — J.C. Patents (57) ABSTRACT

A manufacturing method of a circuit structure is provided as follows. Firstly, a base conductive layer is formed on the carrier board and a first patterned plating-resistant layer having at least one trench for exposing a part of the base conductive layer is formed on the base conductive layer. A first patterned conductive layer is then formed in the trench and a second patterned plating-resistant layer is formed which covers a part of the first patterned conductive layer and a part of the first patterned plating-resistant layer. A second patterned conductive layer is formed on the exposed first patterned conductive layer. The first and the second patterned plating-resistant layers and the base conductive layer exposed by the first patterned conductive layer are removed. Then, a patterned solder mask is formed for covering a part of the first patterned conductive layer.

6 Claims, 6 Drawing Sheets

METHOD OF MAKING A CIRCUIT STRUCTURE

CROSS-REFERENCE TO RELATED APPLICATION

This application claims the priority benefit of Taiwan application serial no. 97119179, filed on May 23, 2008. The entirety of the above-mentioned patent application is hereby incorporated by reference herein and made a part of this specification.

BACKGROUND OF THE INVENTION

1. Field of the Invention

The present invention generally relates to a circuit structure and a manufacturing method thereof, and more particularly, to a circuit structure disposed on a circuit substrate and a manufacturing method of the circuit structure.

2. Description of Related Art

In this information society, people are pursuing products with high speed, high quality and multifunction. As to the product appearance, it is trending toward light, thin and small. Typical electronic products include a chip and a substrate (e.g., chip carrier) connected to the chip. The chip includes an active surface with a plurality of bumps (e.g., gold bumps) disposed thereon, and is electrically connected to a circuit structure of the substrate by flip-chip bonding. The chip can receive a signal from or transmit a signal to the circuit structure of the substrate via the bumps. Therefore, the high reliability of the connecting between the bumps and the circuit structure of the substrate is critically important to the quality of signal transmission.

In addition, a thermal stress may be generated between the chip and the substrate due to unmatched coefficient of thermal expansion. Therefore, an underfill is typically filled in between the chip and the substrate to enclose the bumps to avoid transverse crack of the bumps that could result from a long time influence by the thermal stress between the chip and the substrate.

Figure 1:
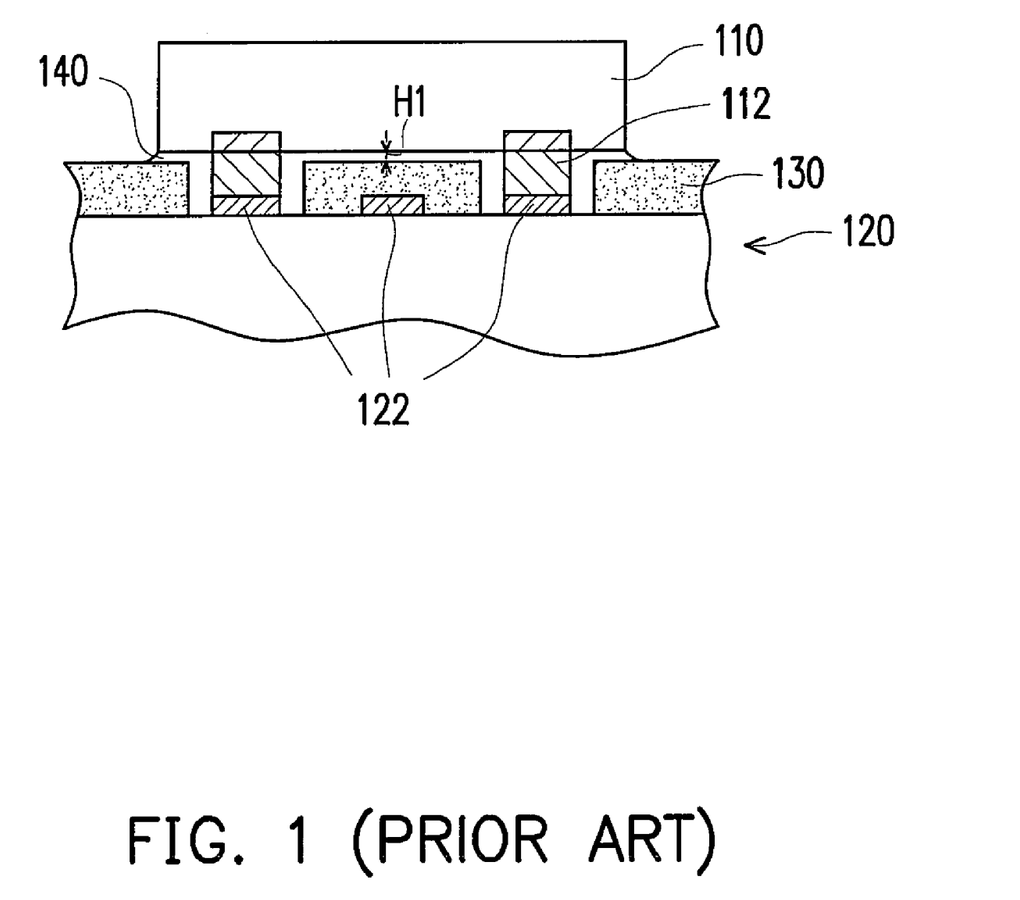
FIG. 1 is a cross-sectional view of a conventional circuit structure.

FIG. 1 is a cross-sectional view of a conventional flip-chip package structure. Referring to FIG. 1, the chip 110 is disposed on a substrate 120 by flip-chip bonding, and the chip 110 includes a plurality of bumps 112 for electrically connecting to a circuit structure 122 of the substrate 120. A solder mask 130 is disposed on the substrate 120 for covering a part of the circuit structure 122. Because the solder mask 130 needs to protect this part of the circuit structure 122 from being influenced during a soldering process, the solder mask 130 needs to maintain a certain thickness. However, if the interval H1 between the chip 110 and the solder mask 130 is too small, the underfill 140 cannot easily be filled in the interval between the chip 110 and the substrate 120, which may affect the reliability of the connecting between the bumps 112 and the circuit structure 122 of the substrate 120. What needed, therefore, is to increase the interval H1 between the chip 110 and the solder mask 130.

SUMMARY OF THE INVENTION

Accordingly, the present invention is directed to a method for making a circuit structure, through which the interval between a chip and a solder mask can be increased.

The present invention is also directed to a circuit structure which, when connected to a chip, has an increased interval between the chip and a solder mask.

The present invention provides a method for making a circuit structure as follows. Firstly, a base conductive layer is formed on a carrier board. A first patterned plating-resistant layer is then formed on the base conductive layer. The first patterned plating-resistant layer comprises at least one trench which exposes a part of the base conductive layer. A first patterned conductive layer is formed in the trench. Next, a second patterned plating-resistant layer is formed which covers the first patterned conductive layer and a part of the first plating-resistant layer. The second patterned plating-resistant layer comprises an opening to expose a part of the first patterned conductive layer. A second patterned conductive layer is then formed on the first patterned conductive layer that is exposed by the opening. Next, the first patterned plating-resistant layer and the second patterned plating-resistant layer are removed. The base conductive layer exposed by the first patterned conductive layer is removed. Finally, a patterned solder mask is formed which covers a part of the first patterned conductive layer. The patterned solder mask comprises at least one opening to expose the second patterned conductive layer and a part of the first patterned conductive layer adjacent to the second patterned conductive layer.

According to one embodiment of the present invention, the material of the first patterned conductive layer is one of copper, aluminum, gold, platinum, nickel, silver, tin, alloy of the above metals, and any combination thereof.

According to one embodiment of the present invention, the material of the second patterned conductive layer is the same as the material of the first patterned conductive layer.

According to one embodiment of the present invention, the material of the first patterned plating-resistant layer and the second patterned plating-resistant layer comprises a photosensitive material.

According to one embodiment of the present invention, the first patterned conductive layer is formed by a plating process, a physical deposition process, or a chemical deposition process.

According to one embodiment of the present invention, the second patterned conductive layer is formed by a plating process, a physical deposition process, or a chemical deposition process.

The present invention also provides a circuit structure suitable for being disposed on a carrier board. The circuit structure comprises a first patterned conductive layer, a second patterned conductive layer, and a solder mask. The first patterned conductive layer is disposed on the carrier board. The second patterned conductive layer is disposed on a part of the first patterned conductive layer. A part of the edge of the second patterned conductive layer and a part of the edge of the first patterned conductive layer are substantially coplanar. The patterned solder mask covers a part of the first patterned conductive layer and has at least one opening for exposing the second patterned conductive layer and a part of the first patterned conductive layer adjacent to the second patterned conductive layer.

According to one embodiment of the present invention, the material of the first patterned conductive layer is one of copper, aluminum, gold, platinum, nickel, silver, tin, alloy of the above metals, and any combination thereof.

According to one embodiment of the present invention, the material of the second patterned conductive layer is the same as the material of the first patterned conductive layer.

According to one embodiment of the present invention, the circuit structure further comprises a base conductive layer disposed between the first patterned conductive layer and the carrier board.

In summary, since in the circuit structure of the present invention, the second patterned conductive layer is only formed at locations where the circuit structure and bumps of the chip are connected, and the patterned solder mask merely covers the first patterned conductive layer. Therefore, the second patterned conductive layer not only can raise the height of the solder pad, but also can increase the interval between the chip and the patterned solder mask, thereby overcoming the problem in the prior art that the underfill is difficult to fill in the interval between the chip and the solder mask due to the small interval between the chip and the solder mask.

In order to make the aforementioned and other features and advantages of the present invention more comprehensible, embodiments accompanied with figures are described in detail below.

DESCRIPTION OF THE EMBODIMENTS

FIGS. 2A through 2G are perspective views illustrating a process for making a circuit structure according to one embodiment of the present invention.

Figure 2A:
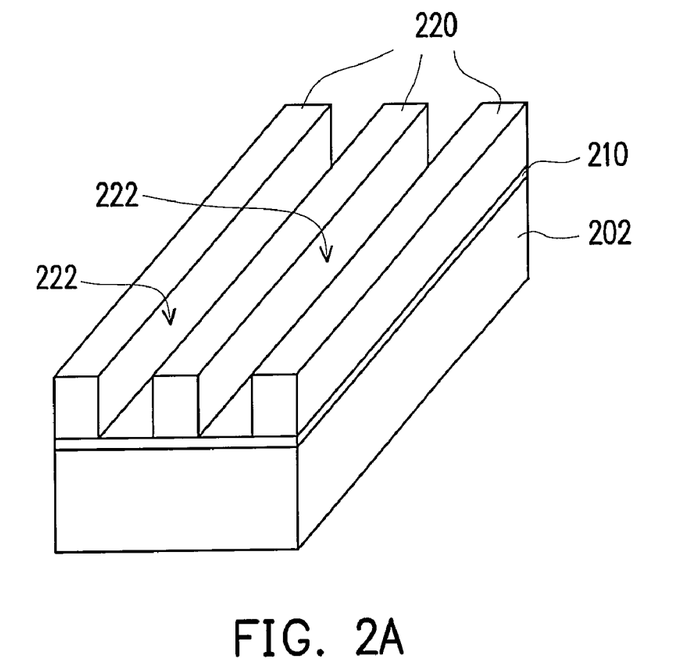
FIGS. 2A through 2G are perspective views illustrating a process for making a circuit structure according to one embodiment of the present invention.

Referring to FIG. 2A, firstly, a base conductive layer 210 is formed on a carrier board 202. In various embodiments of the present invention, the carrier board 202 may be, for example, a dielectric substrate, a single layer circuit substrate, or a multi-layered circuit substrate. In this illustrated embodiment, the carrier board 202 is illustrated as a dielectric substrate for the purpose of description only and should not be regarded as limiting. The base conductive layer 210 may be formed by electroless plating or physical vapor deposition. The electroless plating may be, for example, chemical deposition of copper film. The material of the base conductive layer 210 may be, for example, one of copper, aluminum, gold, platinum, nickel, tin, alloy of the above metals, or any combination thereof, or alternatively be another suitable conductive material.

Next, as shown in FIG. 2A, a first patterned plating-resistant layer 220 is formed on the base conductive layer 210. The first patterned plating-resistant layer 220 has at least one trench 222 which exposes a part of the base conductive layer 210. The material of the first patterned plating-resistant layer 220 is, for example, a photosensitive material, such as, a dry film or a liquid film. In case the photosensitive material is the dry film, the first patterned plating-resistant layer 220 may be formed, for example, by first attaching a layer of photosensitive material on the base conductive layer 210 and subsequently patterning the photosensitive material layer. In case the photosensitive material is the liquid film, the first patterned plating-resistant layer 220 may be formed, for example, by first coating a layer of photosensitive material on the base conductive layer 210 and subsequently patterning the photosensitive material layer. The patterning process used herein includes an exposure and development process or a photo etching process, or the like. The photo etching process includes using a light source, such as, an ultraviolet light, an infrared light or an excimer laser, to directly form the trench 222 in the photosensitive material layer.

Figure 2B:
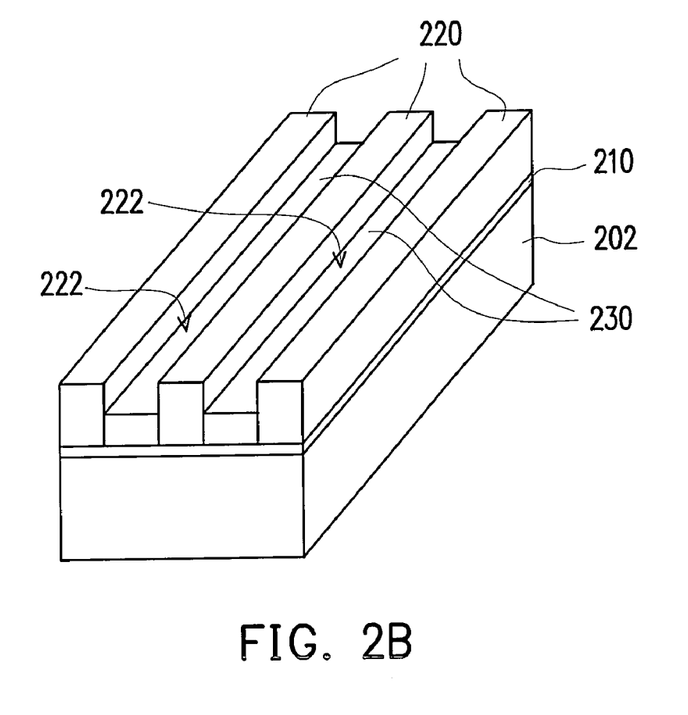

Afterwards, referring to 2B, a first patterned conductive layer 230 is formed in the trench 222. In the illustrated embodiment, the first patterned conductive layer 230 is, for example, a circuitry layer. In addition, in the illustrated embodiment, the first patterned conductive layer 230 may be formed by a plating process or an electroless plating process. The electroless plating process may be a physical deposition or a chemical deposition. It is noted that, since the first patterned plating-resistant layer 220 is formed on the base conductive layer 210, in the illustrated embodiment, the first patterned conductive layer 230 may be formed in a specific area (i.e., the area exposed by the trench 222) on the base conductive layer 210 by using the plating process or the electroless plating process. In various embodiments of the present invention, the material of the first patterned conductive layer 230 may be, for example, one of copper, aluminum, gold, platinum, nickel, silver, tin, alloy of the above metals, and any combination thereof, or alternatively be another suitable conductive material.

Figure 2C:
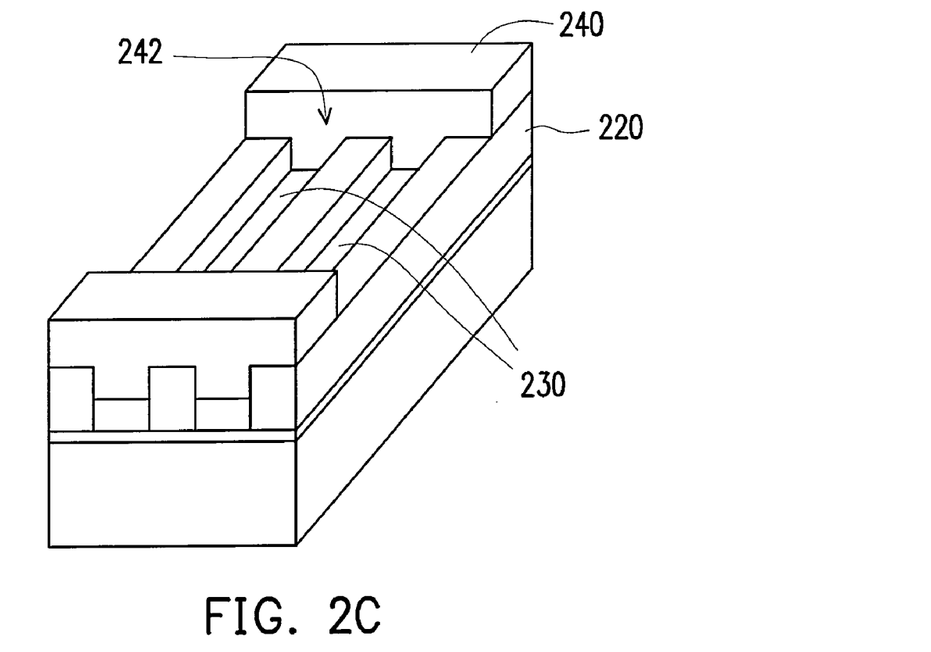

Next, referring to FIG. 2C, a second patterned plating-resistant layer 240 is formed on the first patterned conductive layer 230 and a part of the first patterned plating-resistant layer 220. The second patterned plating-resistant layer 240 has at least one first opening 242 for exposing a part of the first patterned conductive layer 230. The second patterned plating-resistant layer 240 may be formed in the same way as the first patterned plating-resistant layer 220. The material of the second patterned plating-resistant layer 240 may be a photosensitive material such as a dry film or a liquid film.

Figure 2D:
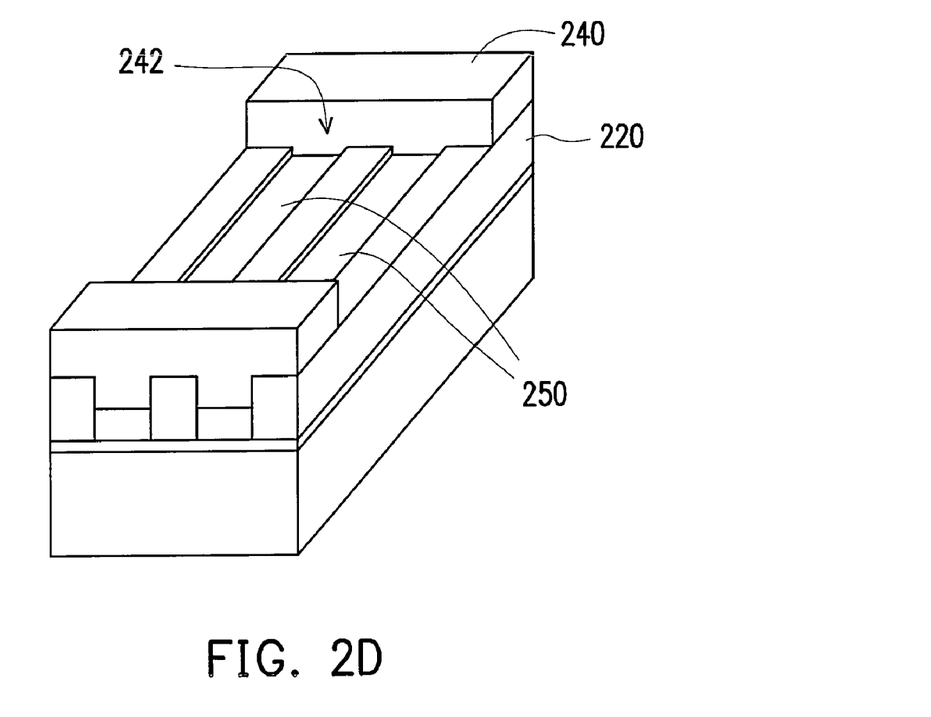

Next, referring to FIG. 2D, a second patterned conductive layer 250 is formed on the first patterned conductive layer 230 that is exposed by the first opening 242 of the second patterned plating-resistant layer 240. In the illustrate embodiment, the second patterned conductive layer 250 may be formed in the same way as the first patterned conductive layer 230. It is noted that, since the second patterned plating-resistant layer 240 covers a part of the first patterned conductive layer 230, the second patterned conductive layer 250 can be selectively formed in a specific area on the first patterned conductive layer 230 (i.e., the area exposed by the first opening 242).

In addition, the material of the second patterned conductive layer 250 may be, for example, one of copper, aluminum, gold, platinum, nickel, silver, tin, alloy of the above metals, and any combination thereof, or alternatively be another suitable conductive material. Besides, in the illustrated embodiment, the material of the first patterned conductive layer 230 may be the same as the material of the second patterned conductive layer 250.

Figure 2E:
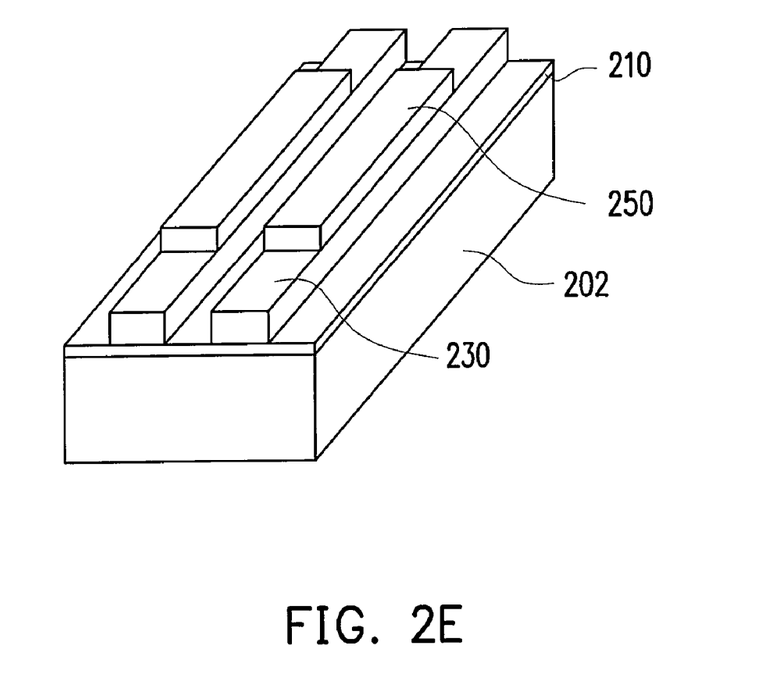
Figure 2F:
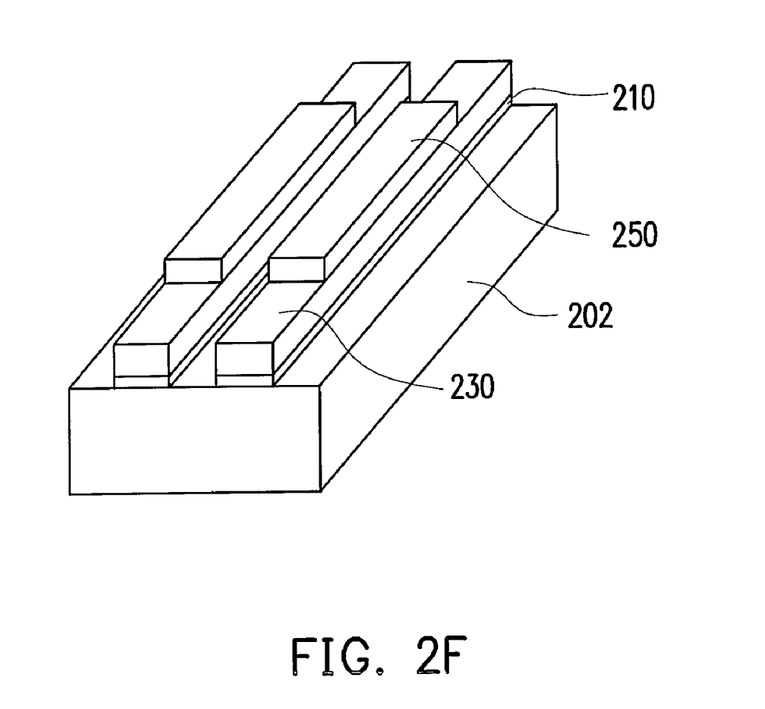

Afterwards, referring to FIG. 2E, the first patterned plating-resistant layer 220 and the second patterned plating-resistant layer 240 are removed. Subsequently, referring to FIG. 2F, the base conductive layer 210 exposed by the first patterned conductive layer 230 is removed by using, for example, an etching process.

Figure 2G:
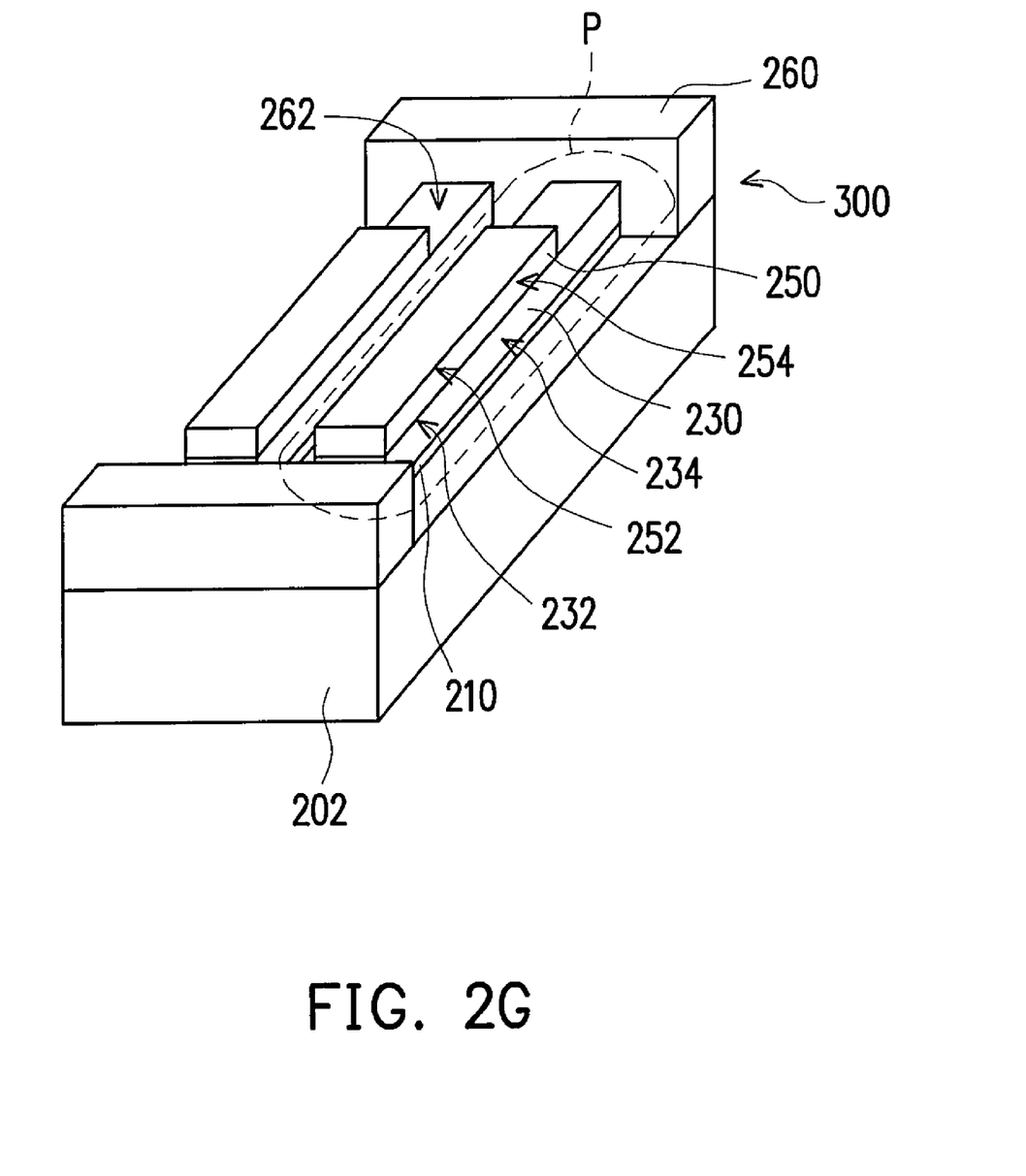

Next, referring to FIG. 2G, a patterned solder mask 260 is formed to cover a part of the first patterned conductive layer 230. The patterned soldering layer 260 includes at least one second opening 262 for exposing the second patterned conductive layer 250 and a part of the first patterned conductive layer 230 adjacent to the second patterned conductive layer 250. In this illustrated embodiment, the patterned solder mask 260 may be formed by, for example, an ink-jet printing process or a traditional image transfer process which involves coating of a soldering-resistant material and a subsequent exposure and development process. The first patterned conductive layer 230, the second patterned conductive layer 250, and the patterned solder mask 260 collectively form a circuit structure 300.

In addition, in the illustrated embodiment, the surfaces of the conductive layers 210, 230, 250 exposed by the solder mask 260 are subjected to a surface anti-oxidation treatment to form an anti-oxidation layer (not shown). These anti-oxidation layers can prevent oxidation of the exposed conductive layer 210, 230, 250. The material of the anti-oxidation layer may be one of nickel and gold, silver, tin, organic solderability preservative (OSP), and any combination thereof, or alternatively be another suitable anti-oxidation material.

The construction of the circuit structure 300 is described in greater detail below.

Referring to FIG. 2G, the circuit structure 300 includes a first patterned conductive layer 230, a second patterned conductive layer 250, and a patterned solder mask 260. The first patterned conductive layer 230 is disposed on a carrier 202. In various embodiments of the present invention, the carrier 202 may be, for example, a dielectric substrate, a single-layered circuit substrate or multi-layered circuit substrate.

The second patterned conductive layer 250 is disposed on a part of the first patterned conductive layer 230, with a part of an edge 252 of the second patterned conductive layer 250 and a part of an edge 232 of the first patterned conductive layer 230 are coplanar. For example, in the illustrated embodiment, the first patterned conductive layer 230 has a first sidewall 234, and the second patterned conductive layer 250 has a second sidewall 254 substantially coplanar with the first sidewall 234.

In addition, in the illustrated embodiment, the material of the first patterned conductive layer 230 may be the same as the material of the second patterned conductive layer 250. Besides, in the illustrated embodiment, a base conductive layer 210 may further be disposed between the first patterned conductive layer 230 and the carrier board 202. The material of the base conductive layer 210 is, for example, one of copper, aluminum, gold, platinum, nickel, tin, alloy of the above metals, and any combination thereof, or alternatively be another suitable conductive material. Furthermore, the material of the base conductive layer 210 is, for example, the same as the material of the first patterned conductive layer 230 and the second patterned conductive layer 250 (e.g., the material of the base conductive layer 210, first conductive layer 230 and second conductive layer 250 are all copper).

A patterned solder mask 260 is formed to cover a part of the first patterned conductive layer 230. The patterned solder mask 260 has at least one second opening 262 for exposing the second patterned conductive layer 250 and a part of the first patterned conductive layer 230 adjacent to the second patterned conductive layer 250. The second patterned layer 250 and the portion of the first patterned conductive layer 230 adjacent to the second patterned conductive layer 250, which are exposed by the second opening 262, may be used as a solder pad P suitable for being connected to bumps of a chip (not shown).

Figure 3:
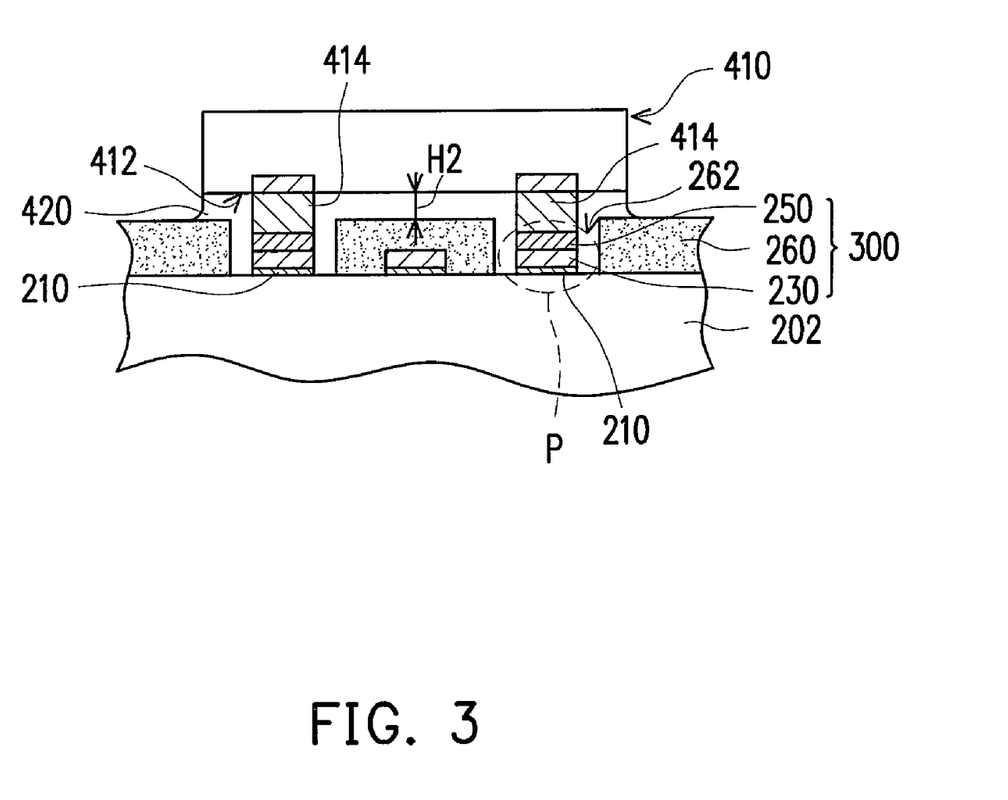
FIG. 3 is a cross-sectional view of a flip-chip package structure formed by a circuit structure according to one embodiment of the present invention and a chip.

FIG. 3 is a cross-sectional view of a flip-chip package structure formed by a circuit structure according to one embodiment of the present invention and a chip. Referring to FIG. 3, the circuit structure 300 of this embodiment is the same as the circuit structure 300 shown in FIG. 2G and, therefore, its construction is not repeated herein. The chip 410 has an active surface 412 with a plurality of bumps 414 formed thereon. While two bumps 414 are shown in FIG. 3, the number of the bumps 414 should not be limited to two and, thus, in other embodiments, the number of the bumps 414 could be more than two. The bumps 414 extend into the second openings 262 of the patterned solder mask 260 to be connected to the second patterned conductive layer 250.

Since in the circuit structure 300 of the illustrated embodiment, the second patterned conductive layer 250 is only formed at locations where the circuit structure 300 and the bumps 414 are connected, the second patterned conductive layer 250 can raise the thickness of the solder pad P thus increasing the height of the solder pad P. In addition, the patterned solder mask 260 merely covers the first patterned conductive layer 230. Therefore, when the height of the solder pad P is raised by the second patterned conductive layer 250, the height of the patterned solder mask 260 will not be increased correspondingly. As a result, the increased height of the solder pad P raised by the second patterned conductive layer 250 can increase the interval H2 between the chip 410 and the patterned solder mask 260, thus facilitating filling the underfill 420 in the interval between the chip 410 and the patterned solder mask 260.

In summary, since in the circuit structure of the present invention, the second patterned conductive layer is only formed at locations where the circuit structure and bumps of the chip are connected, and the patterned solder mask merely covers the first patterned conductive layer. Therefore, the second patterned conductive layer not only can raise the height of the solder pad, but also can increase the interval between the chip and the patterned solder mask, thus facilitating filling the underfill in the interval between the chip and the patterned solder mask, so as to raise the reliability of the connection between bumps of a chip and the circuit structure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method for making a circuit structure, comprising:
    forming a base conductive layer on a carrier board;
    forming a first patterned plating-resistant layer on the base conductive layer, the first patterned plating-resistant layer comprising at least one trench which exposes a part of the base conductive layer;
    forming a first patterned conductive layer in the trench;
    forming a second patterned plating-resistant layer covering the first patterned conductive layer and a part of the first plating-resistant layer, the second patterned plating-resistant layer comprising a first opening to expose a part of the first patterned conductive layer;
    forming a second patterned conductive layer on the first patterned conductive layer that is exposed by the first opening;
    removing the first patterned plating-resistant layer and the second patterned plating-resistant layer;
    removing the base conductive layer that is exposed by the first patterned conductive layer; and
    forming a patterned solder mask covering a part of the first patterned conductive layer, the patterned solder mask comprising at least one second opening to expose the second patterned conductive layer and a part of the first patterned conductive layer adjacent to the second patterned conductive layer.

2. The method for making the circuit structure according to claim 1, wherein the material of the first patterned conductive layer is one of copper, aluminum, gold, platinum, nickel, silver, tin, alloy of the above metals, and any combination thereof.

3. The method for making the circuit structure according to claim 1, wherein the material of the second patterned conductive layer is the same as the material of the first patterned conductive layer.

4. The method for making the circuit structure according to claim 1, wherein the material of the first patterned plating-resistant layer and the second patterned plating-resistant layer comprises a photosensitive material.

5. The method for making the circuit structure according to claim 1, wherein the first patterned conductive layer is formed by one of a plating process, a physical deposition process, and a chemical deposition process.

6. The method for making the circuit structure according to claim 1, wherein the second patterned conductive layer is formed by one of a plating process, a physical deposition process, and a chemical deposition process.

* * * * *